United States Patent
Bridges et al.

(10) Patent No.: US 9,185,819 B2
(45) Date of Patent: Nov. 10, 2015

(54) SEQUENCED ORTHOGONAL DISCONNECTION OF ELECTRONIC MODULES

(71) Applicant: Lenovo Enterprise Solutions (Singapore) Pte. Ltd., Singapore (SG)

(72) Inventors: Jeremy S. Bridges, Apex, NC (US); Daniel P. Kelaher, Holly Springs, NC (US); William M. Megarity, Raleigh, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 203 days.

(21) Appl. No.: 14/146,842

(22) Filed: Jan. 3, 2014

(65) Prior Publication Data
US 2015/0195940 A1    Jul. 9, 2015

(51) Int. Cl.
*H05K 7/02* (2006.01)
*H05K 5/02* (2006.01)

(52) U.S. Cl.
CPC .................. *H05K 7/02* (2013.01); *H05K 5/023* (2013.01); *H05K 5/0291* (2013.01); *H05K 5/0295* (2013.01); *H05K 5/0282* (2013.01); *H05K 5/0286* (2013.01)

(58) Field of Classification Search
CPC ....... H05K 5/023; H05K 7/02; H05K 5/0295; H05K 5/0282; H05K 5/0286; H05K 5/0291; H05K 5/00; H05K 5/02; H05K 5/0217; H02G 3/08; H02G 3/081; G06F 1/187
USPC ......................... 361/740, 754, 759
See application file for complete search history.

(56) References Cited

U.S. PATENT DOCUMENTS

| | | | | |
|---|---|---|---|---|
| 3,792,387 A | | 2/1974 | Arrington et al. | |
| 4,975,805 A | * | 12/1990 | Schmutzler | H05K 7/1411 360/99.02 |
| 5,179,871 A | * | 1/1993 | Orimoto | G06K 13/08 360/96.3 |
| 5,432,673 A | * | 7/1995 | Ogami | G06F 1/1616 361/679.32 |
| 5,466,166 A | * | 11/1995 | Law | G06K 7/0047 439/157 |
| 5,679,013 A | * | 10/1997 | Matsunaga | H01R 13/453 439/144 |
| 6,176,724 B1 | * | 1/2001 | Klatt | H05K 3/365 439/326 |
| 6,282,099 B1 | * | 8/2001 | Wilson | G06F 1/184 361/727 |

(Continued)

OTHER PUBLICATIONS

Xiaolong Yuan et al., "A Smart Hot Swap Controller IC design", 2005 IEEE.

*Primary Examiner* — Zachary M Pape
*Assistant Examiner* — Douglas Burtner
(74) *Attorney, Agent, or Firm* — Katherine S. Brown; Andrew M. Calderon; Roberts Mlotkowski Safran & Cole, P.C.

(57) ABSTRACT

An electronic enclosure includes a first electronic module, a second electronic module, a third electronic module and a handle. The first electronic module is physically connected to the second electronic module and the third electronic module is physically connected to the second electronic module. The second electronic module vertically disengages from the first electronic module and the third electronic module horizontally disengages from the second electronic module. The handle forces sequenced orthogonal disconnection of the electronic modules such that the third electronic module horizontally disengages from the second electronic module prior to the second electronic module vertically disengages from the first electronic module.

20 Claims, 6 Drawing Sheets

(56) References Cited

U.S. PATENT DOCUMENTS

| | | | |
|---|---|---|---|
| 6,666,724 B1* | 12/2003 | Lwee | G06K 7/0043 439/138 |
| 6,884,096 B2* | 4/2005 | Centola | H01R 13/62933 361/798 |
| 6,896,539 B2* | 5/2005 | Dobbs | H05K 1/144 361/802 |
| 7,023,703 B2 | 4/2006 | Peloza | |
| 7,027,309 B2* | 4/2006 | Franz | H01R 13/62933 361/732 |
| 2002/0001181 A1* | 1/2002 | Kondo | G06K 7/0047 361/728 |
| 2002/0176235 A1* | 11/2002 | Kasahara | B60R 11/02 361/752 |
| 2006/0221581 A1 | 10/2006 | Handley et al. | |
| 2006/0221582 A1 | 10/2006 | DeNies et al. | |
| 2008/0080156 A1* | 4/2008 | Ligtenberg | G06F 1/1613 361/801 |
| 2010/0067199 A1 | 3/2010 | Chen | |
| 2012/0002364 A1* | 1/2012 | Goodman | G06F 1/187 361/679.33 |
| 2012/0275120 A1 | 11/2012 | Nguyen | |
| 2013/0301215 A1* | 11/2013 | Trotman | H05K 7/1418 361/679.58 |
| 2015/0017828 A1* | 1/2015 | Li | G06F 1/185 439/345 |

* cited by examiner

SEQUENCED ORTHOGONAL DISCONNECTION OF ELECTRONIC MODULES

FIELD

Embodiments of invention generally relate to electronic enclosures, and more particularly to an electronic enclosure including a first electronic module, a second electronic module that is vertically disengaged from the first electronic module, and a third electronic module that is horizontally disengaged from the second electronic module.

DESCRIPTION OF THE RELATED ART

Electronic modules (e.g. assemblies, electronic devices, field replaceable units, etc.) within an electronic enclosure such as a server or storage system may be physically connected in order to transmit electrical signals or data from one module to another. In some instances, a particular module needs to be removed in one direction so another module can be removed in an orthogonal direction. In these cases, if the proper removal sequence is not followed, the modules may become damaged.

SUMMARY

Embodiments of invention generally relate to electronic enclosures including a first electronic module, a second electronic module that is vertically disengaged from the first electronic module subsequent to a third electronic module being horizontally disengaged from the second electronic module.

In a first embodiment of the present invention, an electronic enclosure includes a first electronic module, a second electronic module, a third electronic module and a handle. The first electronic module is physically connected to the second electronic module and the third electronic module is physically connected to the second electronic module. The second electronic module vertically disengages from the first electronic module and the third electronic module horizontally disengages from the second electronic module. The handle forces sequenced orthogonal disconnection of the electronic modules such that the third electronic module horizontally disengages from the second electronic module prior to the second electronic module vertically disengages from the first electronic module.

In another embodiment of the present invention, an method for sequenced orthogonal disconnection of electronic modules within an electronic enclosure includes providing within the electronic enclosure a handle that forces a third electronic module to horizontally disengage from a second electronic module and subsequently forces the second electronic module to vertically disengage from a first electronic module.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Details of the claimed embodiments are disclosed herein. However, it is understood that the disclosed embodiments are merely illustrative of the structures, devices, systems, methods, etc. that may be embodied in various forms. These exemplary embodiments are provided so that this disclosure will be thorough and complete and will convey the scope of this invention to those skilled in the art. In the description, details of well-known features and techniques may be omitted to avoid unnecessarily obscuring the presented embodiments.

Figure 1:
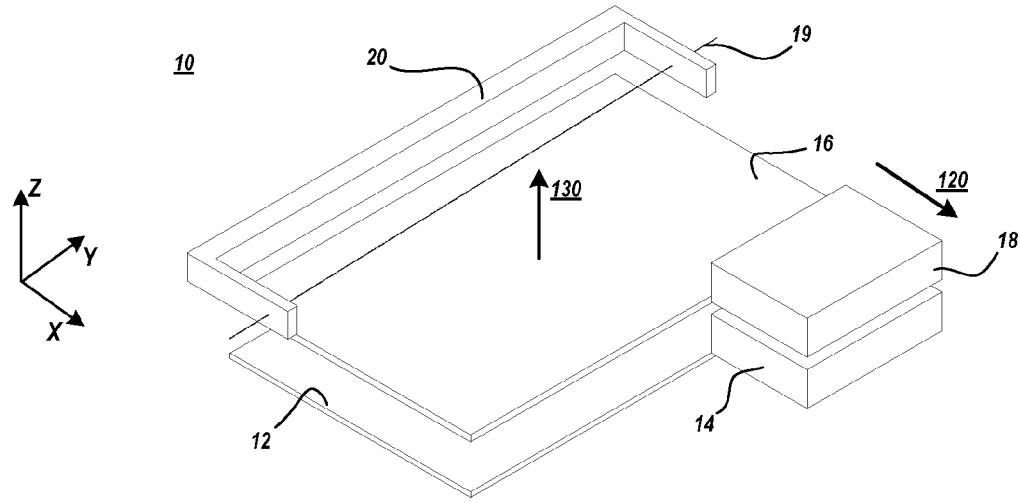
FIG. 1 depicts an electronic enclosure comprising various electronic modules, in accordance with various embodiments of the present invention.

FIG. 1 depicts an electronic enclosure 10 including various electronic modules, in accordance with various embodiments of the present invention. For purposes of this document, an electronic module may be any electronic device, assembly, subassembly, replaceable unit, hot pluggable system, etc. that physically connects with other electronic modules to transfer electronic signals and/or data within electronic enclosure 10. A non limiting listing of exemplary electronic modules is as follows: system board assembly, power supply, back plane assembly, DIMM tray, adapter card, storage drive, air moving device, auxiliary board assembly, etc.

In certain embodiments, electronic enclosure 10 is a server computing system (e.g. 2 U server, 4 U server, etc.). Still in other embodiments, electronic enclosure 10 may be another data handling device, such as, a storage system, client system, computer system, etc. Generally, electronic enclosure 10 may be any data handling device comprised of various electronic modules.

In certain embodiments, electronic enclosure 10 includes a system board 12, an auxiliary board 16, and a power supply 18. Though noted as singular components, system board 12, auxiliary board 16, and/or power supply 18 may be assemblies made up of various subcomponents.

System board 12 may be a motherboard, a main board, a planar board, logic board, etc. and is a main printed circuit board (PCB) of electronic enclosure 10. Typically, system board 12 includes many of the electronic components of electronic enclosure 10, such as a central processing unit (CPU), memory, etc. and may provide connectors to connect peripherals to electronic enclosure 10. In accordance with various embodiments of the present invention, system board 12 may include a connector to physically connect with auxiliary board 16. The connector allows the transfer of electronic signals and/or data between system board 12 and auxiliary board 16.

Auxiliary board 16 may be a system board, back plane, etc. and is generally allows for increased electronic components within electronic enclosure 10. In certain embodiments auxiliary board 16 may take the form of a second system board 12. In other embodiments, auxiliary board 16 differs from system board 12. For example, auxiliary board 16 may comprise DIMM modules and take the form of DIMM tray assembly. In other examples, auxiliary board 16 includes one or more similar electronic components of system board 12, but lacks, for example, a CPU. In accordance with various embodiments of the present invention, auxiliary board 16 may include a connector to physically connect with system board 12. The connector allows the transfer of electronic signals and/or data between system board 12 and auxiliary board 16. Also in accordance with various embodiments of the present invention, the auxiliary board 16 is generally vertically engaged (e.g. connected, etc.) and disengaged (e.g. disconnected, etc.) to/from system board 12. For example, auxiliary board 16 is disengaged from system board 12 in direction 130 generally along an Z-axis.

Power supply 18 is a device that supplies electric power to at least auxiliary board 16. In certain embodiments, power supply 18 also supplies electric power to system board 12. In other embodiments, system board is supplied electric power from power supply 14. In accordance with various embodiments of the present invention, auxiliary board 16 may include a connector to physically connect with power supply 18. The connector allows the supply of electric power between power supply 18 and auxiliary board 16. Also in accordance with various embodiments of the present invention, power supply 18 is generally horizontally engaged (e.g. connected, etc.) and disengaged (e.g. disconnected, etc.) to/from auxiliary board 16. For example, power supply 18 is disengaged from auxiliary board 16 in direction 120 generally along an X-axis.

For clarity, system board 12, auxiliary board 16, and power supply 18 are merely exemplary modules of electronic enclosure 10. In other embodiments, electronic enclosure 10 may include additional or substitute modules. For example, a particular electronic enclosure 10 includes a system board 12, an auxiliary board 16, and a hard drive in lieu of power supply 18. Another particular electronic device 10 may include a first system board 12, a second system board 12 in lieu of auxiliary board 16, and fan assembly in lieu of power supply.

The electronic enclosure 10, and electronic modules thereof, shown in FIG. 1 are intended to be a simplified representation, it being understood that many variations in electronic enclosure 10 configuration, operation, and/or implementation are possible in addition to those specifically mentioned herein.

In certain embodiments, a handle 20 is provided to at least disengage power supply 18 from auxiliary board 16 and subsequently disengage auxiliary board 16 from system board 12. In this manner, handle 20 may provide for sequenced orthogonal disconnection of various electronic modules as further described herein. In certain embodiments, handle 20 is provided to also engage auxiliary board 16 to system board 12, etc. In accordance with various embodiments of the present invention, to disengage power supply 18 from auxiliary board 16 and subsequently disengage auxiliary board 16 from system board 12, handle 20 may be rotated about axis 19.

Figure 2:
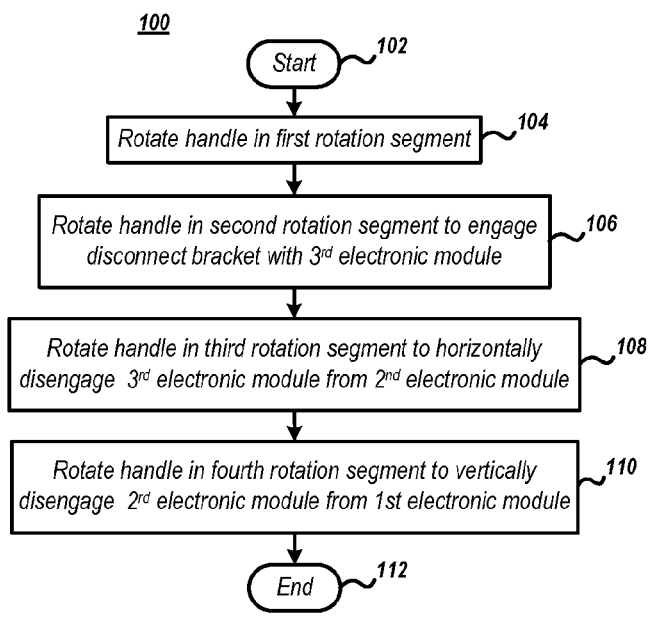
FIG. 2 depicts a block diagram of a method for sequenced orthogonal disconnection of electronic modules, according to various embodiments of the present invention.
Figure 3:
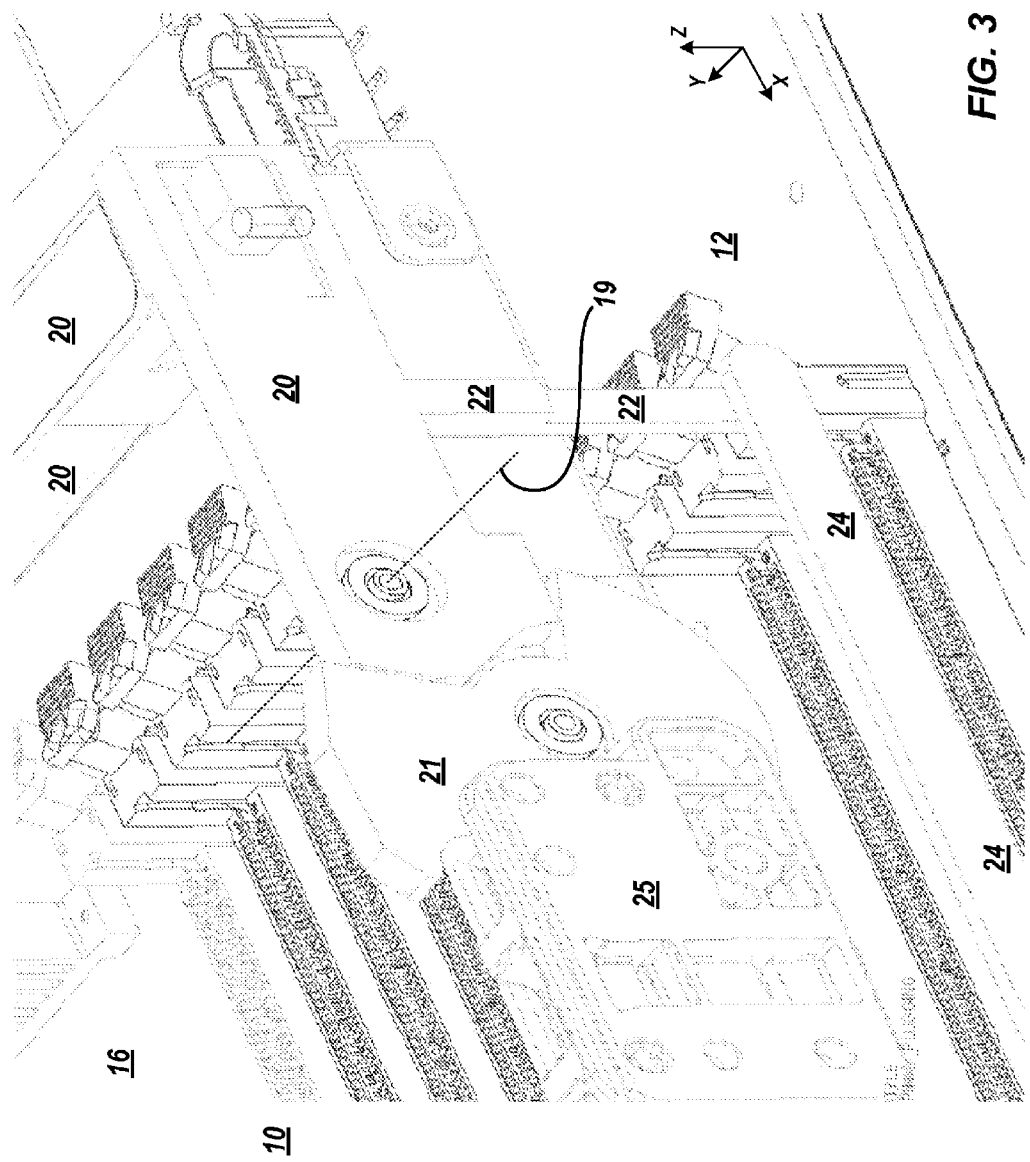
FIG. 3-FIG. 7 depict various electronic module components, according to various embodiments of the present invention.
Figure 4:
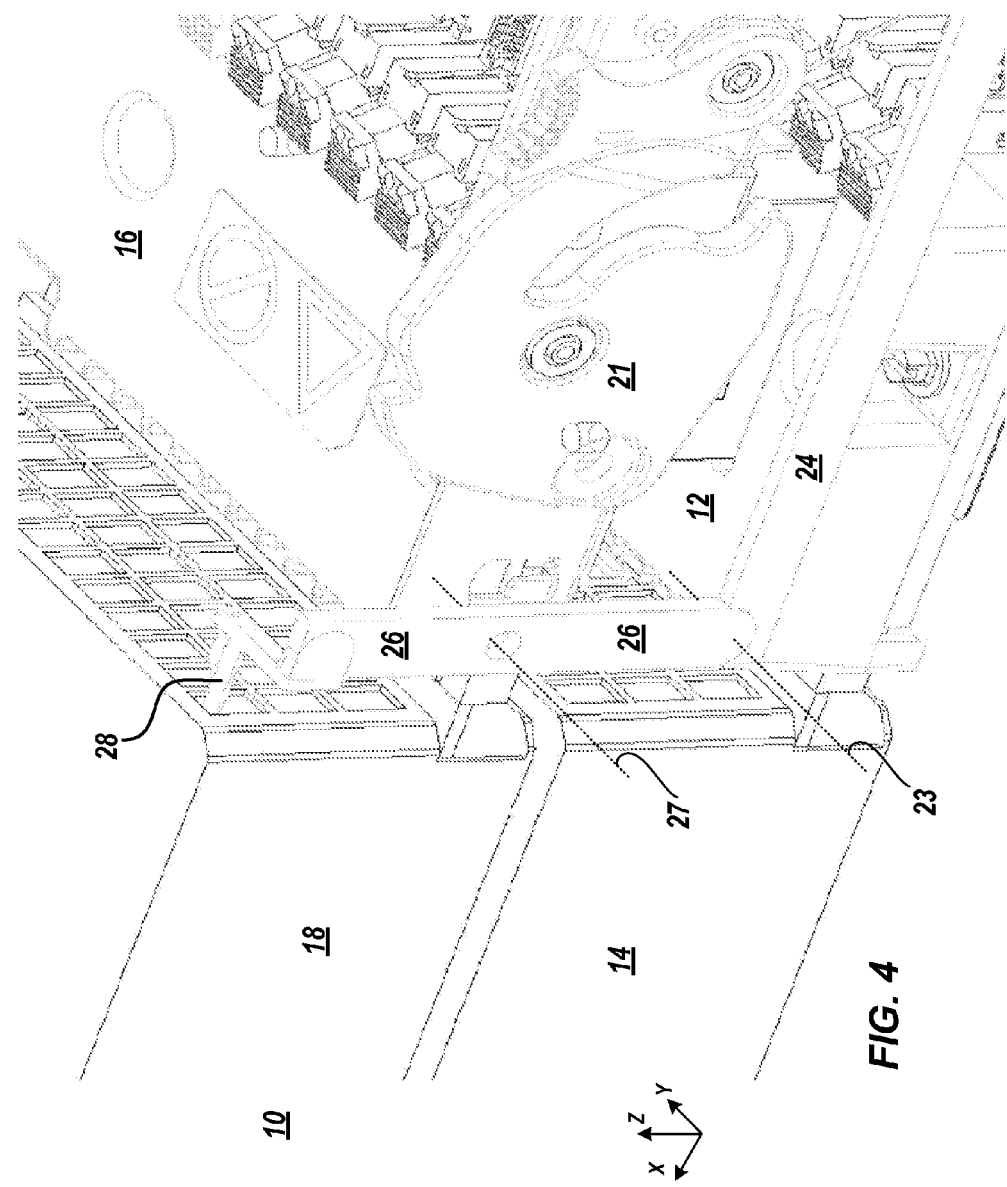
Figure 5:
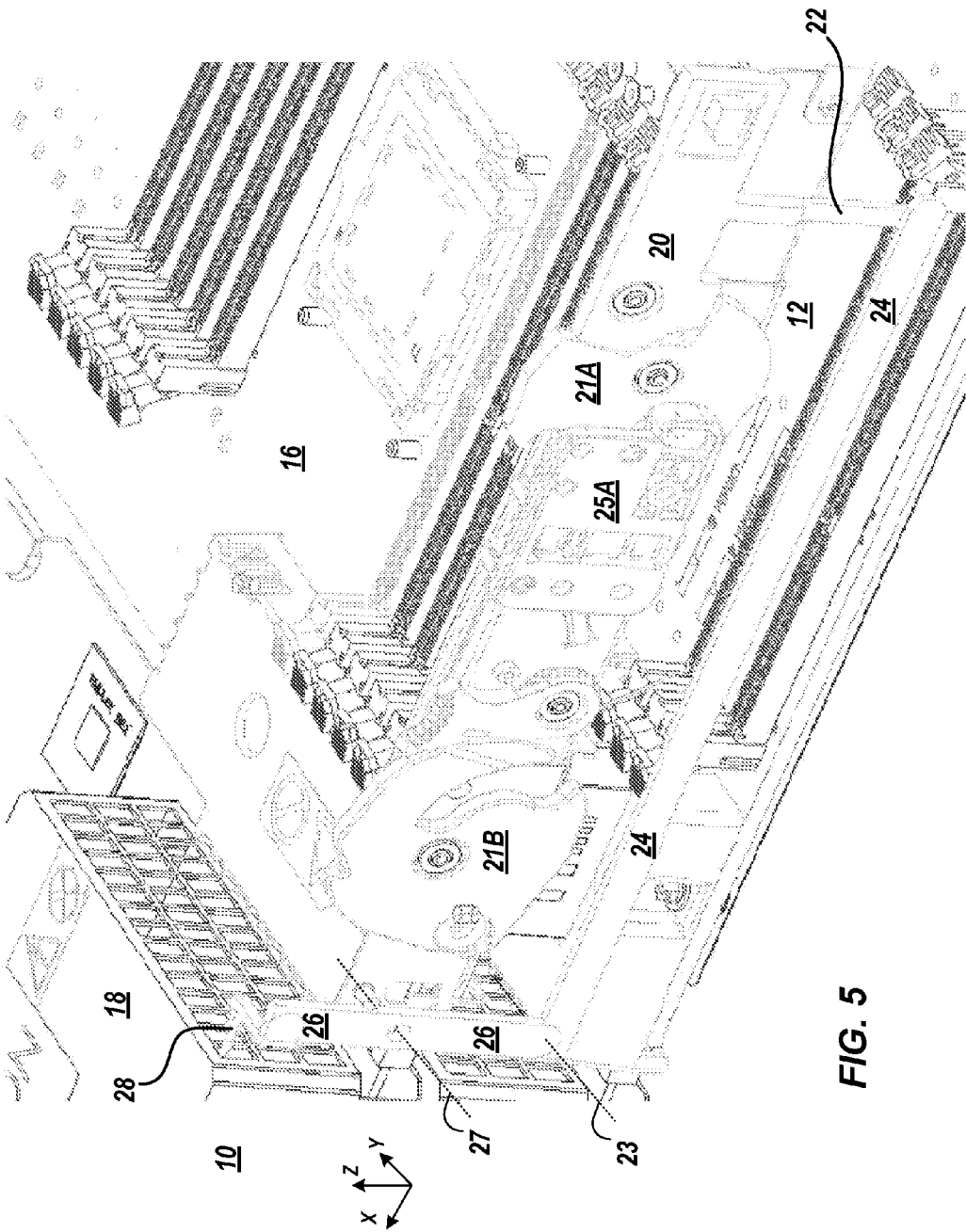
Figure 6:
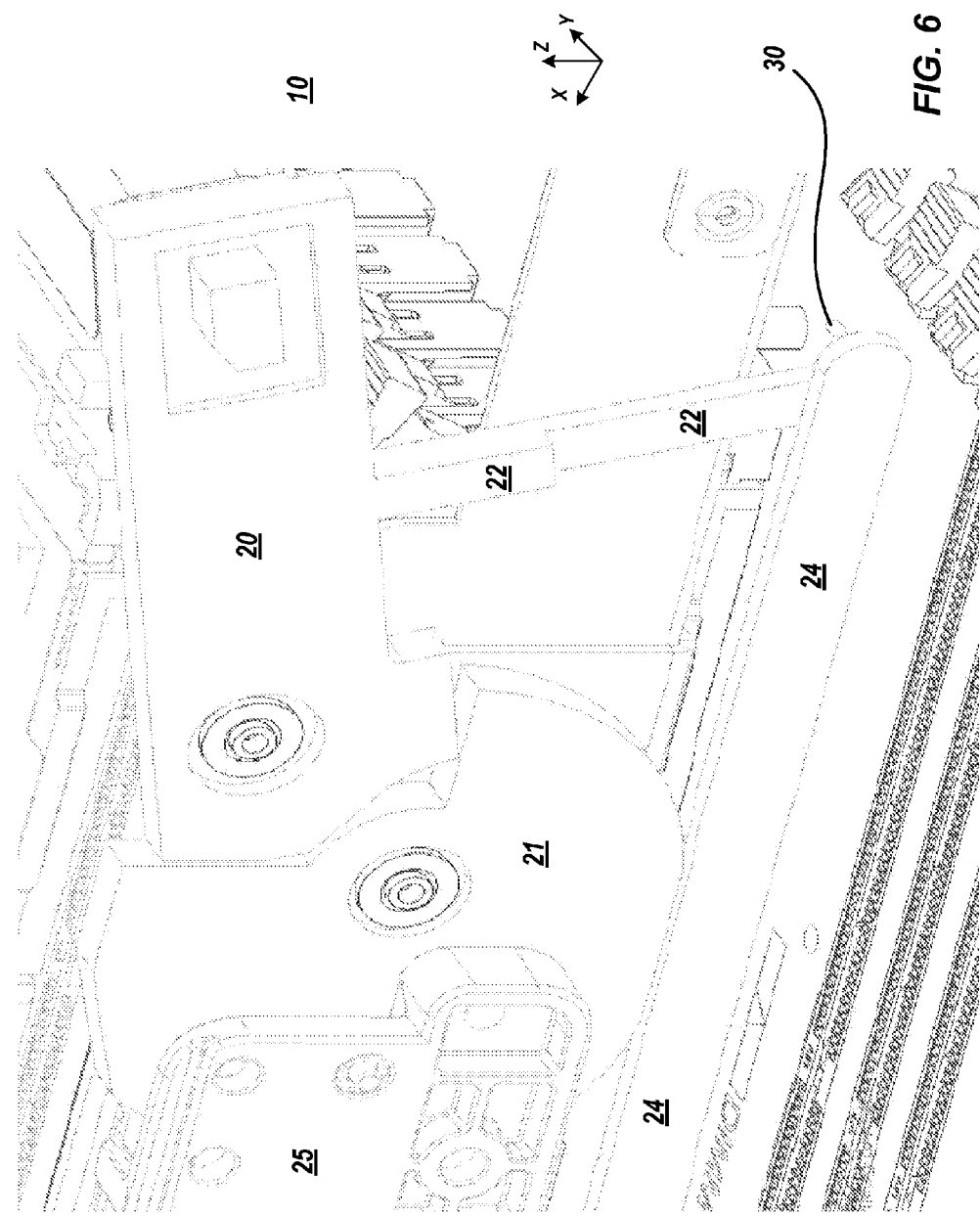
Figure 7:
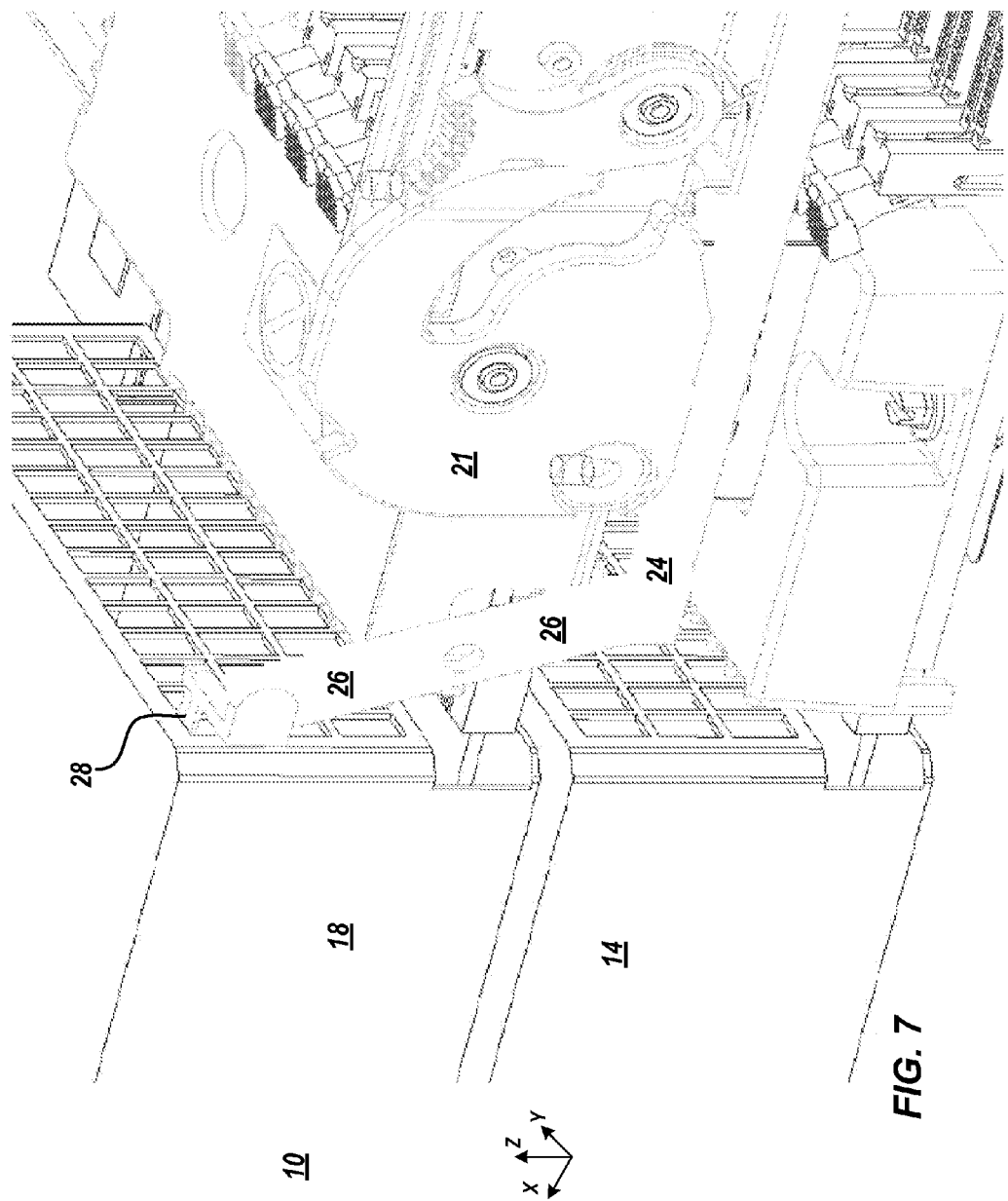

FIG. 2 depicts a block diagram of a method 100 for sequenced orthogonal disconnection of electronic modules, according to various embodiments of the present invention. Method 100 begins at block 102 and continues by rotating handle 20 in a first rotation segment (block 104). For example, handle 20 may be rotated 20 degrees about axis 19. In the first rotation segment handle 20 may not exert disconnection forces through one or more disconnection features further described herein, but may allow a user to grip handle 20.

Method 100 continues with rotating handle 20 in a second rotation segment to engage a disconnect bracket 26 with a 3rd electronic module (block 106). For example, handle 20 may be rotated another 20 degrees about axis 19 thereby moving slider 24 to engage disconnect bracket 26 with power supply 18. Disconnect bracket 26 is engaged with power supply 18 by, for example, making physical contact with power supply 18.

Method 100 continues with rotating handle 20 in a third rotation segment to horizontally disengage the 3rd electronic module from the 2nd electronic module (block 108). For example, handle 20 may be rotated another 20 degrees about axis 19 to further move slider 24 and further engage disconnect bracket 26 with power supply 18. In this manner, disconnect bracket 26 exerts a removal force upon power supply 18 to horizontally disengage power supply 18 from auxiliary board 16 in direction 120. Power supply 18 is horizontally disengaged from auxiliary board 16 when the power supply 18 connector is disconnected from the associated auxiliary board 16 connector, such that auxiliary board 16 is free to be vertically disengaged from system board 12 (e.g. power supply 18 no longer limits auxiliary board 16 from being vertically disengaged from system board 12, etc.).

Method 100 continues with rotating handle 20 in a fourth rotation segment to vertically disengage the 2nd electronic module from the 1st electronic module (block 110). For example, handle 20 may be rotated a final 30 degrees about axis 19 to vertically disengage auxiliary board 16 from system board 12. The segmented rotational sequence ensures that power supply 18 is horizontally disengaged prior to vertical movement of auxiliary board 16, thereby reducing the probability of power supply 18, auxiliary board 16, system board 12, etc. damage. Method 100 ends at block 112.

FIG. 3-FIG. 7 depict various electronic module components, according to various embodiments of the present invention. In certain embodiments, electronic enclosure 10 further includes a chassis made of, for example, sheet metal. For clarity, chassis is not shown in FIG. 3-FIG. 7 to allow for the depiction of other electronic enclosure 10 components.

In certain embodiments, a user may be intended to disengage the various electronic modules (e.g. for service, repair, rework, etc.) of electronic enclosure 10. Therefore, the user may grip and rotate handle 20, for example, about axis 19 in a first rotation segment (e.g. 10-30 degrees, etc.). The first rotation segment allows handle 20 to generally rise with a Z-axis component to allow the user to get an adequate grip of handle 20 for further handle 20 rotation. In certain embodiments, no electronic module disengagement occurs during the first rotation segment.

The user may continue rotating handle 20 in a second rotation segment (e.g. 5-30 degrees, etc.) whereby extension 22 of handle 20 generally moves with a negative X-axis component and engages slider 22. Extension 22 may be integrated into handle 20 or may be a separate component that attaches or connects to handle 20. Extension 22 is generally fixedly connected to handle 20 and thereby movement between extension 22 and handle 20 typically does not occur. In certain embodiments extension 22 may engage a post 30 of slider 22. When extension moves with the negative X-axis component and engages slider 24, slider 24 moves in a negative X-axis direction. In certain embodiments, slider 24 is retained from moving in the Z-axis and/or Y-axis by a retainer (not shown) attached or connected to, for example, electronic enclosure 10 chassis sidewall.

In certain embodiments, a disconnect bracket 26 may be connected to an opposite end of slider 24. The disconnect bracket 26 may be a separate component from slider 24 rotatably connected with slider 24 about axis 23. For example, disconnect bracket 26 may connected to slider 24 via a fastener that allows for relative rotation. In certain embodiments, disconnect bracket 26 rotates about axis 27. Disconnect bracket 26 may be retained by a retainer (not shown) attached or connected to, for example, electronic enclosure 10 chassis sidewall. The disconnect bracket 26 retainer may or may not be the same retaining apparatus as the slider 24 retainer. In certain embodiments, disconnect bracket 26 may be rotatably connected to the retainer at axis 27 via a fastener that allows for relative rotation. In certain embodiments, disconnect bracket 26 may includes protrusion 28 at an opposite end of disconnect bracket 26. Protrusion 28 is positioned to contact electronic module and therefore may have an X-axis length, Y-axis length, etc. to protrude through a housing that contains the third electronic module. For example, protrusions 28 are configured to protrude through one or more openings in a power supply housing that contains power supply 18. Protrusion 28 is generally fixedly connected to disconnect bracket 26. Protrusion 28 may be integrated into disconnect bracket 26 or may be a separate component that attaches or connects to disconnect bracket 26. Protrusion 28 is generally fixedly connected to disconnect bracket 26 and thereby movement between protrusion 28 and disconnect bracket 26 typically does not occur.

In the second rotation segment, slider 22 moves in a negative X-axis direction and engages disconnect bracket 26 at axis 23 thereby causing disconnect bracket 26 rotation at axis 27. The rotation about axis 27 causes protrusions 28 to move with a positive X-axis component. In the second rotation segment, protrusions 28 move along the X-axis to contact an electronic module (e.g. power supply 18, etc.). In a third rotation segment, handle 20 is further rotated about axis 19 (e.g. 5-30 degrees, etc.) and protrusions 28 move along the X-axis to exert a force against the electronic module (e.g. power supply 18, etc.) to horizontally disengage the electronic module in direction 120.

In a fourth rotation segment, handle 20 is further rotated about axis 19 (e.g. 5-30 degrees, etc.) and handle 20 engages with cam 21. Handle 21 may generally fit with an acceptance feature of cam 21 (e.g. a notch within cam components 21A, etc.). In certain embodiments, cam 21 includes a single cam component 21A. In other embodiments, cam 21 includes multiple components 21A and 21B. Cam 21 component 21A may generally rotate about an Y-axis. When multiple cam components are utilized, cam 21 may also include a bracket connecting cam components 21A and 21B. In certain embodiments, the rotation of handle 20 drives rotation of cam component 21A also causing rotation of cam component 21B via the bracket. In certain embodiments cam 21 is included within an electronic module. For example, cam 21 may be included within auxiliary board 16.

In the fourth rotation segment, cam 21 begins to rotate (e.g. cam component 21A rotates, etc.) and engages fixed feature 25. In certain embodiments, fixed feature 25 is fixedly connected to electronic enclosure 10 chassis side wall. In certain embodiments, fixed feature is a fixed feature apart of the retainer (not shown) attached or connected to, for example, electronic enclosure 10 chassis sidewall. In certain embodiments fixed feature 25 includes multiple components (i.e. fixed component 25A, 25B (not shown), etc.). Cam 21 engages fixed feature 25 (e.g. cam component 21A engages fixed component 25A, etc.). The relative rotation of cam 21 versus the fixed feature 25 generates an upward force upon the electronic module attached to cam 21. For example, the rotation of cam 21 generates a vertical force to disengage auxiliary board 12 from system board 12. Continued rotation of handle 21 drives rotation of cam 21 against fixed feature and generates a threshold vertical force to vertically disengage the second electronic module from the first electronic module in direction 130.

The segmented rotation of handle 20 ensures that the third electronic module (e.g. power supply 18) is horizontally disengaged prior to vertically disengaging the second electronic module (e.g. auxiliary board 16) and ensures sequenced orthogonal disconnection of various electronic modules within electronic enclosure 10.

The drawings are not necessarily to scale. The drawings are merely schematic representations, not intended to portray specific parameters of the invention. The drawings are intended to depict only exemplary embodiments of the invention. In the drawings, like numbering represents like elements.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as used herein is defined as a plane parallel to the conventional plane or surface of system board 12, regardless of the actual spatial orientation of the system board. The term "vertical" refers to a direction perpendicular to the horizontal, as just defined. Terms, such as "on", "above", "below", "side", "top", "bottom", "higher", "lower", "over", "beneath" and "under" are defined with respect to the horizontal plane. It is understood that various other frames of reference may be employed for describing the present invention without departing from the spirit and scope of the present invention.

The invention claimed is:
1. An electronic enclosure comprising:
 a first electronic module physically connected to a second electronic module that vertically disengages from the first electronic module;
 a third electronic module physically connected to the second electronic module, the third electronic module horizontally disengages from the second electronic module, and;
 a handle that forces the third electronic module to horizontally disengage from the second electronic module and subsequently forces the second electronic module to vertically disengage from the first electronic module.
2. The electronic enclosure of claim 1 wherein the handle forces the third electronic module to horizontally disengage from the second electronic module and subsequently forces the second electronic module to vertically disengage from the first electronic module by segmented rotation.
3. The electronic enclosure of claim 2 wherein a first rotation segment allows a user to adequately grasp the handle.
4. The electronic enclosure of claim 2 wherein a second rotation segment causes a disconnection bracket to contact the third electronic module.
5. The electronic enclosure of claim 2 wherein a third rotation segment causes a disconnection bracket to force the third electronic module to horizontally disengage from the second electronic module.

6. The electronic enclosure of claim 2 wherein a fourth rotation segment causes a cam comprised within the second module to force the second electronic module to vertically disengage from the first electronic module.

7. The electronic enclosure of claim 1 wherein the first electronic module is a system board assembly.

8. The electronic enclosure of claim 1 wherein the second electronic module is an auxiliary board assembly.

9. The electronic enclosure of claim 1 wherein the third electronic module is a power supply assembly.

10. A method for sequenced orthogonal disconnection of electronic modules within an electronic enclosure comprising:
providing within the electronic enclosure a handle that forces a third electronic module to horizontally disengage from a second electronic module and subsequently forces the second electronic module to vertically disengage from a first electronic module.

11. The method of claim 10 further comprising:
providing for segmented rotation of the handle to force the third electronic module to horizontally disengage from the second electronic module and subsequently force the second electronic module to vertically disengage from the first electronic module by segmented rotation.

12. The method of claim 11 wherein segmented rotation of the handle comprises:
rotating the handle in a first rotation segment to allow a user to adequately grasp the handle.

13. The method of claim 11 wherein segmented rotation of the handle comprises:
rotating the handle in a second rotation segment to cause a disconnection bracket to contact the third electronic module.

14. The method of claim 11 wherein segmented rotation of the handle comprises:
rotating the handle in a third rotation segment to cause a disconnection bracket to force the third electronic module to horizontally disengage from the second electronic module.

15. The method of claim 11 wherein segmented rotation of the handle comprises:
rotating the handle in a fourth rotation segment to cause a cam comprised within the second module to force the second electronic module to vertically disengage from the first electronic module.

16. The method of claim 10 wherein the first electronic module is a system board assembly.

17. The method of claim 10 wherein the second electronic module is an auxiliary board assembly.

18. The method of claim 10 wherein the third electronic module is a power supply assembly.

19. The method of claim 10 wherein the third electronic module is a hard drive assembly.

20. The method of claim 11 wherein the handle is rotated at least 5 degrees within each rotation segment.

* * * * *